(12) United States Patent
Park et al.

(10) Patent No.: US 8,993,396 B2
(45) Date of Patent: Mar. 31, 2015

(54) CAPACITOR AND METHOD FOR FABRICATING THE SAME

(75) Inventors: Jong-Kook Park, Gyeonggi-do (KR); Yong-Tae Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 92 days.

(21) Appl. No.: 13/596,007

(22) Filed: Aug. 27, 2012

(65) Prior Publication Data

US 2013/0299942 A1 Nov. 14, 2013

(30) Foreign Application Priority Data

May 8, 2012 (KR) .................. 10-2012-0048557

(51) Int. Cl.
*H01L 21/77* (2006.01)
*H01L 49/02* (2006.01)
*H01L 29/94* (2006.01)
*H01L 29/66* (2006.01)
*H01L 27/108* (2006.01)

(52) U.S. Cl.
CPC .............. *H01L 28/91* (2013.01); *H01L 28/87* (2013.01); *H01L 29/94* (2013.01); *H01L 29/66181* (2013.01); *H01L 28/60* (2013.01); *H01L 27/10805* (2013.01); *H01L 27/10847* (2013.01); *H01L 27/1085* (2013.01); *H01L 27/10808* (2013.01); *H01L 29/945* (2013.01)
USPC .... 438/238; 257/532; 257/301; 257/E27.092; 257/E29.346; 257/E27.048; 257/E21.014; 257/E21.651; 438/190; 438/171; 438/243; 438/244; 438/386; 438/387

(58) Field of Classification Search
None
See application file for complete search history.

(56) References Cited

U.S. PATENT DOCUMENTS

2007/0272963 A1* 11/2007 Kishida .................. 257/301
2012/0064689 A1* 3/2012 Hirota et al. ............. 438/381

FOREIGN PATENT DOCUMENTS

| KR | 1020000067767 | 11/2000 |
|---|---|---|
| KR | 1020050087176 | 8/2005 |
| KR | 1020060058359 | 5/2006 |
| KR | 1020080084284 | 9/2008 |
| KR | 1020090113613 | 11/2009 |

* cited by examiner

*Primary Examiner* — Fei Fei Yeung Lopez
(74) *Attorney, Agent, or Firm* — IP & T Group LLP (57) ABSTRACT

A method for fabricating a capacitor includes forming a mold structure over a substrate, wherein the mold structure has a plurality of open parts and has a mold layer stacked with a support layer; forming cylinder type lower electrodes in the open parts; forming a first upper electrode over an entire surface of a structure including the cylinder type lower electrodes to fill the cylinder type lower electrodes; defining a through hole that passes through portions of the first upper electrode and the support layer; removing the mold layer through the through hole and exposing the cylinder type lower electrodes; forming a second upper electrode to fill the through hole and spaces between the cylinder type lower electrodes; and forming a third upper electrode to connect the second upper electrode and the first upper electrode with each other.

26 Claims, 12 Drawing Sheets

CAPACITOR AND METHOD FOR FABRICATING THE SAME

CROSS-REFERENCE TO RELATED APPLICATIONS

The present application claims priority of Korean Patent Application No. 10-2012-0048557, filed on May 8, 2012, which is incorporated herein by reference in its entirety.

BACKGROUND

1. Field

Exemplary embodiments of the present invention relate to a semiconductor device, and more particularly, to a capacitor and a method for fabricating the same.

2. Description of the Related Art

As design rule parameters decrease, a full dip-out process becomes inevitable when fabricating a capacitor with a lower electrode. The full dip-out process refers to a process for fully removing a mold layer after forming the lower electrode.

However, in the full dip-out process, leaning of the lower electrode may occur.

In order to address such a feature, an NFC (nitride floating capacitor) structure is used, in which a support layer including a nitride layer is formed to fixate a plurality of lower electrodes so as to prevent leaning of the lower electrodes. Recently, since a capacitor with a high aspect ratio is used, prevention of leaning of a lower electrode by the NFC structure is desired.

Nevertheless, because of a limited space for forming a cylinder type lower electrode (storage node) in high degree integration, forming a dielectric layer and an upper electrode becomes difficult. While the thickness of the cylinder type lower electrode may be decreased to secure the inner space of the cylinder type lower electrode, leaning is likely to occur in the full dip-out process since support for the cylinder type lower electrode becomes weak. Also, if the thickness of the cylinder type lower electrode is decreased even though the NFC structure is used, cylinder type lower electrodes are likely to lean and touch one another in the full dip-out process.

SUMMARY

Embodiments of the present invention are directed to a capacitor which can prevent leaning of a lower electrode and a method for fabricating the same.

In accordance with an embodiment of the present invention, a method for fabricating a capacitor may include: forming a plurality of cylinder type lower electrodes; forming a first upper electrode inside the cylinder type lower electrodes; forming a second upper electrode outside the cylinder type lower electrodes; and forming a third upper electrode that connects the first upper electrode and the second upper electrode.

In accordance with another embodiment of the present invention, a method for fabricating a capacitor may include: forming a mold structure over a substrate, wherein the mold structure has a plurality of open parts and has a mold layer stacked with a support layer; forming cylinder type lower electrodes in the open parts; forming a first upper electrode over an entire surface of a structure including the cylinder type lower electrodes to fill the cylinder type lower electrodes; defining a through hole that passes through portions of the first upper electrode and the support layer; removing the mold layer through the through hole and exposing the cylinder type lower electrodes; forming a second upper electrode to fill the through hole and spaces between the cylinder type lower electrodes; and forming a third upper electrode to connect the second upper electrode and the first upper electrode with each other.

In accordance with yet another embodiment of the present invention, a method for fabricating a capacitor includes: forming a mold layer over a substrate, wherein the mold layer has a plurality of open parts; forming cylinder type lower electrodes in the open parts; forming a first upper electrode over an entire surface of a structure including the cylinder type lower electrodes to fill the cylinder type lower electrodes; defining a through hole that passes through a portion of the first upper electrode; removing the mold layer through the through hole and exposing the cylinder type lower electrodes; forming a second upper electrode to fill the through hole and spaces between the cylinder type lower electrodes; and forming a third upper electrode to connect the second upper electrode and the first upper electrode with each other.

In accordance with still another embodiment of the present invention, a capacitor may include: a plurality of cylinder type lower electrodes; a support layer supporting outer walls of the cylinder type lower electrodes and having a through hole that opens spaces between the cylinder type lower electrodes; a first upper electrode formed in the cylinder type lower electrodes; a second upper electrode surrounding the outer walls of the cylinder type lower electrodes; and a third upper electrode connecting the first upper electrode and the second upper electrode with each other.

BRIEF DESCRIPTION OF THE DRAWINGS

FIGS. 2A to 2I are cross-sectional views illustrating a method for fabricating the capacitor in accordance with the first embodiment of the present invention.

FIGS. 4A to 4I are cross-sectional views illustrating a method for fabricating the capacitor in accordance with the second embodiment of the present invention.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1A:
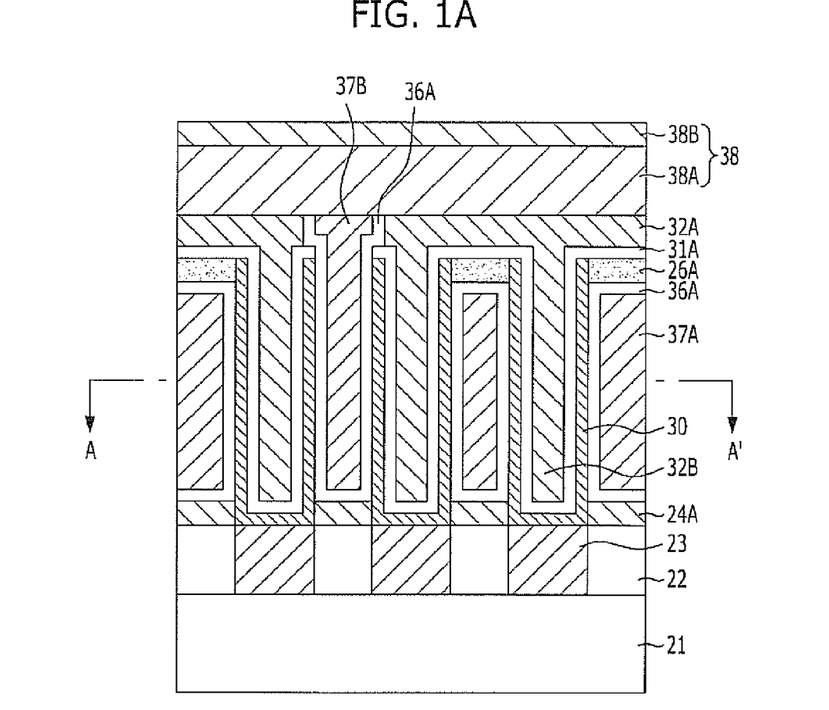
FIG. 1A is a cross-sectional view illustrating a capacitor in accordance with a first embodiment of the present invention.
Figure 1B:
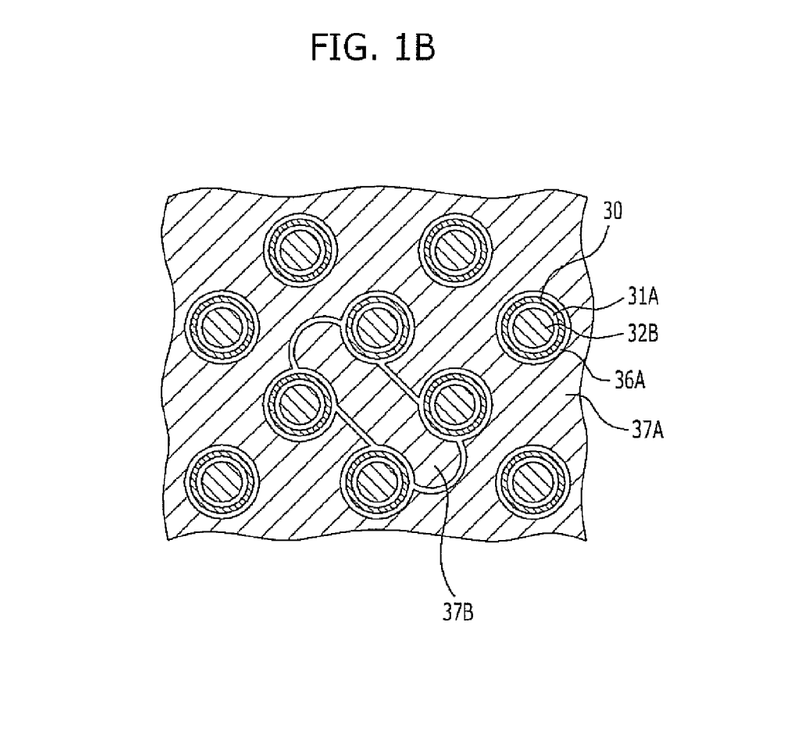
FIG. 1B is a cross-sectional view taken along the line A-A' of FIG. 1A.

FIG. 1A is a cross-sectional view illustrating a capacitor in accordance with a first embodiment of the present invention. FIG. 1B is a cross-sectional view taken along line A-A' of FIG. 1A.

Referring to FIGS. 1A and 1B, an interlayer dielectric layer 22 is formed on a semiconductor substrate 21. A plurality of contact plugs 23 are formed in contact holes, which are defined in the interlayer dielectric layer 22. Cylinder type lower electrodes 30 are formed on the contact plugs 23. An etch stop layer 24A is formed on the outer walls of the lower end portions of the lower electrodes 30. A support layer 26A is formed on the outer walls of the upper end portions of the lower electrodes 30. The support layer 26A is partially removed. A first upper electrode 32A is formed in the lower electrodes 30. The first upper electrode 32A may include pillar parts 32B, which fill the lower electrodes 30. A first dielectric layer 31A is formed between the first upper electrode 32A and the lower electrodes 30. A second upper electrode 37A is formed outside the lower electrodes 30, that is, between the lower electrodes 30. The second upper electrode 37A has a shape for surrounding the outer walls of the lower electrodes 30. The second upper electrode 37A may include a connection part 37B, which is filled through the partially removed portion of the support layer 26A. A second dielectric layer 36A is formed between the second upper electrode 37A and the lower electrodes 30. A third upper electrode 38 is formed on the first and second upper electrodes 32A and 37A. The connection part 37B of the second upper electrode 37A and the first upper electrode 32A are connected with each other through the third upper electrode 38. The third upper electrode 38 may be formed by stacking a silicon germanium layer 38A and a tungsten layer 38B.

According to FIGS. 1A and 1B, the first upper electrode 32A is formed in the cylinder type lower electrodes 30, the second upper electrode 37A is formed outside the cylinder type lower electrodes 30, and the third upper electrode 38 is formed on the second upper electrode 37A. The second upper electrode 37A has a shape for surrounding the outer walls of the cylinder type lower electrodes 30. The third upper electrode 38 electrically connects the first upper electrode 32A and the second upper electrode 37A.

As described above, in the capacitor in accordance with the first embodiment of the present invention, an upper electrode is constituted by the first to third upper electrodes 32A, 37A and 38. The first upper electrode 32A serves as a prop for preventing the lower electrodes 30 from leaning or bending. More specifically, since the pillar parts 32B of the first upper electrode 32A fill the lower electrodes 30, supporting force increases. Moreover, because the supporting force increases by the pillar parts 32B of the first upper electrode 32A, the thickness of the lower electrodes 30 may be decreased.

FIGS. 2A to 2I are cross-sectional views illustrating a method for fabricating the capacitor in accordance with the first embodiment of the present invention.

Figure 2A:
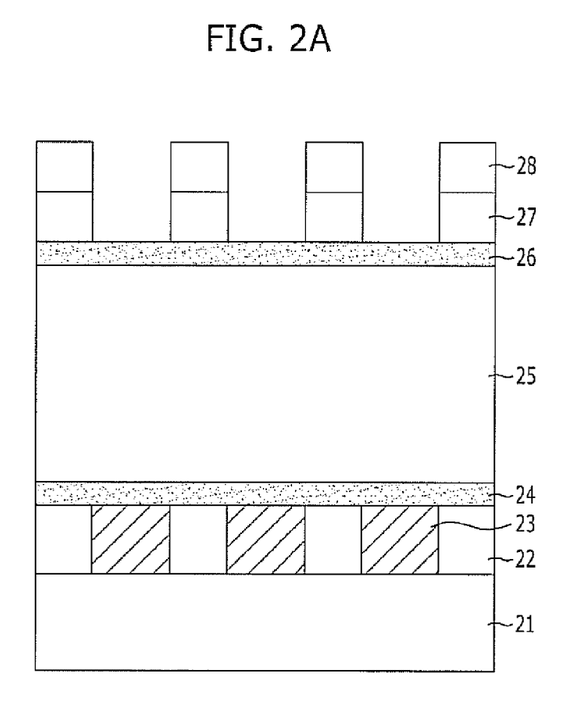

Referring to FIG. 2A, a plurality of contact plugs 23 are formed on a semiconductor substrate 21 to pass through an interlayer dielectric layer 22. The semiconductor substrate 21 includes a silicon-containing substance. For example, the semiconductor substrate 21 may include a silicon substrate, a silicon germanium substrate, or the like. The interlayer dielectric layer 22 may include a silicon oxide such as BPSG. While not shown, a process for forming transistors and wiring lines may be additionally performed on the semiconductor substrate 21 before forming the interlayer dielectric layer 22.

The contact plugs 23 may be connected to impurity regions (not shown) that are formed in the semiconductor substrate 21 through contact holes defined in the interlayer dielectric layer 22. The contact plugs 23 may be formed by forming a conductive layer in the contact holes and subsequently planarizing the conductive layer until the upper surface of the interlayer dielectric layer 22 is exposed. The contact plugs 23 may include a metal layer, a metal nitride layer, a noble metal layer, a refractory metal layer, polysilicon, or the like.

An etch stop layer 24 is formed on the interlayer dielectric layer 22 including the contact plugs 23. The etch stop layer 24 may include a dielectric substance. For example, the etch stop layer 24 may include a nitride such as a silicon nitride.

A mold layer 25 is formed on the etch stop layer 24. The mold layer 25 is a substance provided to form lower electrodes (or storage nodes). The mold layer 25 includes a substance with a high etching selectivity with respect to the etch stop layer 24. Also, the mold layer 25 includes a substance easily removable through wet etching. For example, the mold layer 25 may include an oxide such as a silicon oxide. In another embodiment, the mold layer 25 may include a multi-layered oxide. For example, the mold layer 25 may include BPSG, USG, PETEOS, PSG, HDP, or the like. In still another embodiment, the mold layer 25 may include a silicon-containing substance. For example, the mold layer 25 may include a polysilicon layer or a silicon germanium layer.

A support layer 26 is formed on the mold layer 25. The support layer 26 may include a nitride such as a silicon nitride. The support layer 26 prevents lower electrodes from leaning in a subsequent full dip-out process. The support layer 26 may include a substance with a high etching selectivity with respect to the mold layer 25. In the case where the mold layer 25 is formed as a silicon oxide layer, the support layer 26 may be formed as a silicon nitride layer. However, a substance of the support layer 26 is not limited to the materials described above.

Next, hard mask patterns 27 are formed on the support layer 26. The hard mask patterns 27 may be formed using first photoresist patterns 28. The hard mask patterns 27 may include a silicon nitride layer, amorphous carbon, or the like.

Figure 2B:
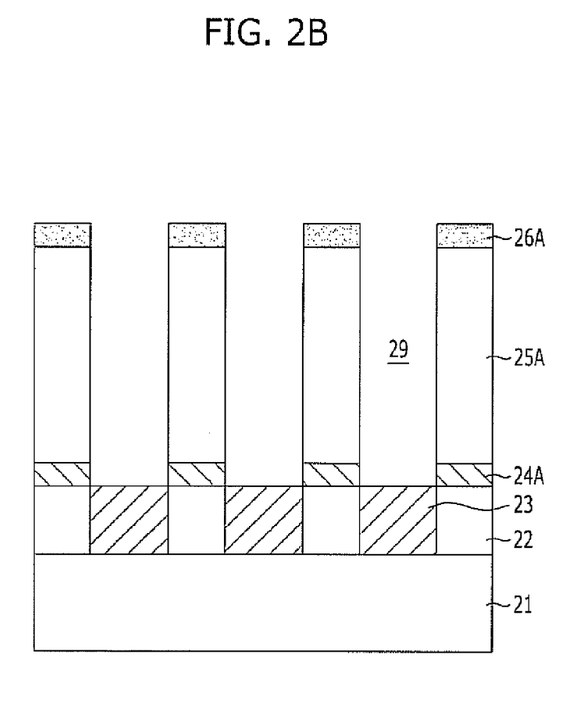

Referring to FIG. 2B, after stripping the first photoresist patterns 28, the support layer 26 is etched using the hard mask patterns 27 as an etch barrier. In succession, by etching the mold layer 25, open parts 29 are defined to expose the contact plugs 23. The open parts 29 respectively expose the surfaces of the contact plugs 23. The open parts 29 may have the shapes of contact holes. In order to define the open parts 29, the support layer 26 and the mold layer 25 may be etched until stopping at the etch stop layer 24, and subsequently, the etch stop layer 24 may be etched. Accordingly, the open parts 29 are defined in the stack structure of an etch stop layer 24A, a mold layer 25A and a support layer 26A. Lower electrodes are formed in the open parts 29 in a subsequent process.

Next, the hard mask patterns 27 are removed.

Figure 2C:
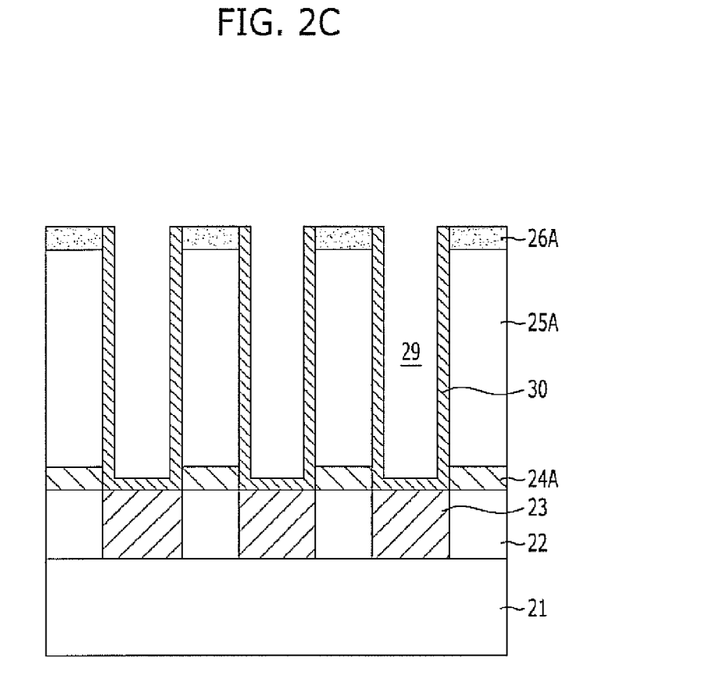

Referring to FIG. 2C, lower electrodes 30 are formed in the open parts 29.

The lower electrodes 30 may be a cylinder type or a pillar type. Herein, the lower electrodes 30 will be referred to as cylinder type lower electrodes.

In order to form the lower electrodes 30, a first conductive layer may be deposited on the entire surface including the open parts 29, and subsequently a lower electrode separating process may be performed. The first conductive layer as the lower electrodes 30 may be formed as a metal layer, a metal nitride layer or a stack layer in which a metal layer and a metal nitride layer are stacked. The first conductive layer may be formed through chemical vapor deposition (CVD) or atomic layer deposition (ALD). For example, the lower electrodes 30 may be formed as a stack layer in which a titanium layer and a titanium nitride layer are stacked.

Since the lower electrodes 30 are the cylinder type, the lower electrodes 30 have inner walls and outer walls, and the outer walls of the upper end portions of adjoining lower electrodes 30 are fixed by the support layer 26A.

Figure 2D:
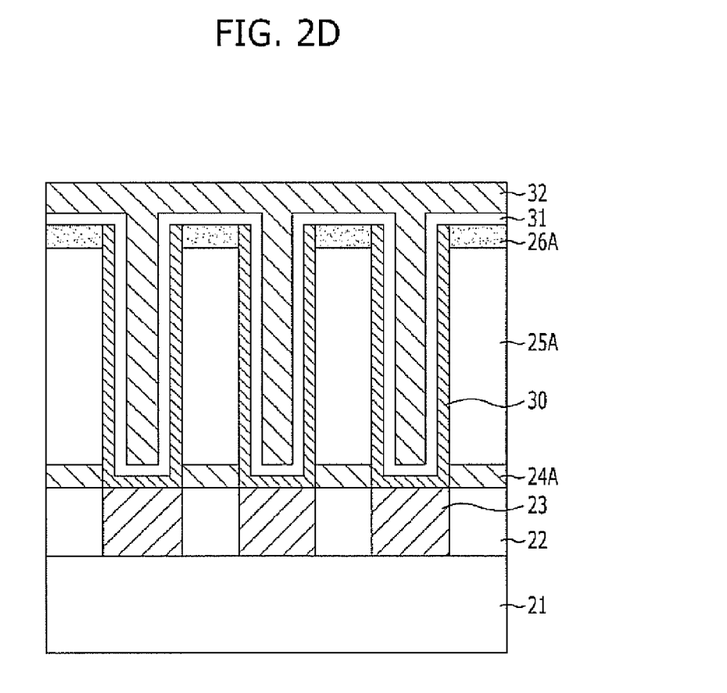

Referring to FIG. 2D, a first dielectric layer 31 and a second conductive layer 32 are sequentially formed on the entire surface including the lower electrodes 30. The second conductive layer 32 becomes a first upper electrode. The second conductive layer 32 includes a metal nitride layer. For example, the second conductive layer 32 may include a titanium nitride layer (TiN). The second conductive layer 32 is filled in the cylinders of the lower electrodes 30 over the first dielectric layer 31.

Figure 2E:
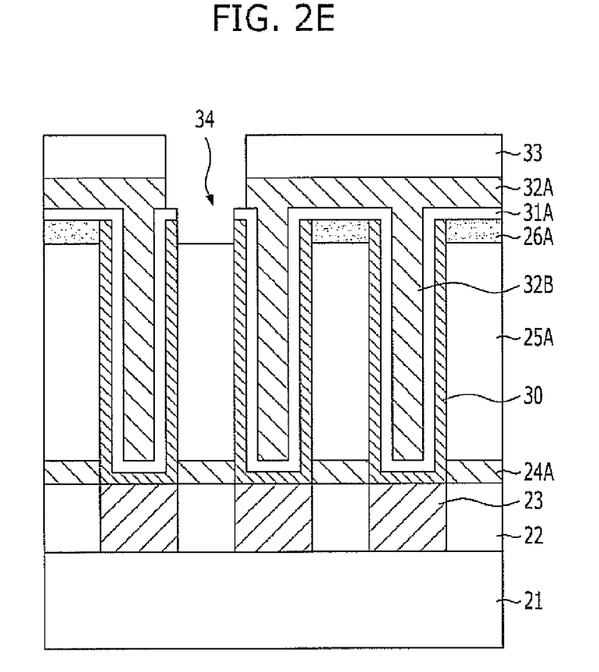

Referring to FIG. 2E, a nitride floating cap (NFC) mask 33 is formed on the second conductive layer 32. The NFC mask 33 is a mask for selectively etching a portion of the support layer 26A.

Using the NFC mask 33 as an etch barrier, the second conductive layer 32 and the first dielectric layer 31 are etched, and in succession, the portion of the support layer 26A is etched. Thus, a through hole 34 through which a chemical is to flow subsequently is defined. The through hole 34 is used as a path for passing the chemical to remove the mold layer 25A. The number of through holes 34 may be selectively controlled.

By defining the through hole 34 in this way, the second conductive layer 32 becomes a first upper electrode 32A. The first upper electrode 32A includes pillar parts 32B, which fill the cylinder type lower electrodes 30, and covers the upper parts of the cylinder type lower electrodes 30. After defining of the through hole 34, the first dielectric layer 31 remains as designated by the reference numeral 31A. Because the pillar parts 32B of the first upper electrode 32A fill the lower electrodes 30, supporting force is increased.

Figure 2F:
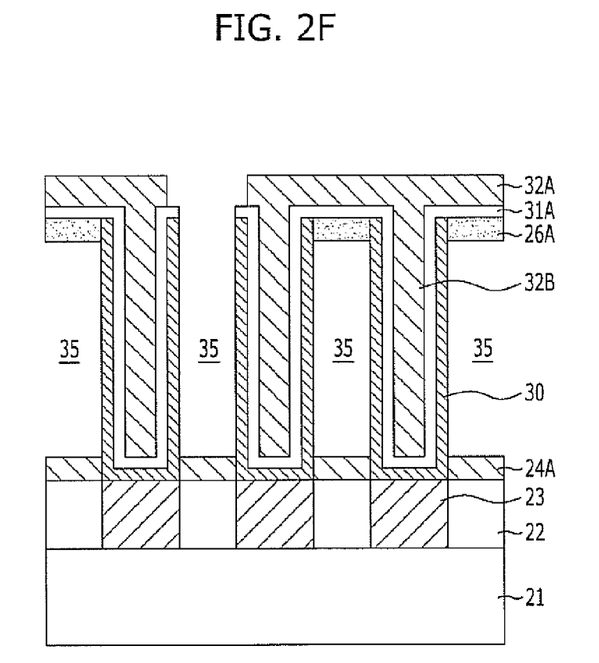

Referring to FIG. 2F, the NFC mask 33 is removed.

The mold layer 25A exposed through the through hole 34 is fully removed. To this end, a full dip-out process is performed. The full dip-out process may be performed using a wet chemical. The lower electrodes 30, the first dielectric layer 31A and the first upper electrode 32A are not removed. In particular, since the first dielectric layer 31A, which uses an oxide similarly to the mold layer 25A, is interposed between the lower electrodes 30 and the first upper electrode 32A and is not exposed to the chemical, the first dielectric layer 1A is not etched. Also, the contact plugs 23 are not damaged due to the presence of the etch stop layer 24A. Here, the full dip-out process may use a hydrofluoric acid-based chemical.

As the mold layer 25A is entirely removed as described above, empty spaces 35 are defined outside the lower electrodes 30. Since the first dielectric layer 31A and the pillar parts 32B of the first upper electrode 32A are filled in the lower electrodes 30, a structure for preventing the lower electrodes 30 from leaning or bending is obtained. In other words, because the first dielectric layer 31A and the first upper electrode 32A are filled in the cylinders of the lower electrodes 30, the lower electrodes 30 are prevented from leaning or bending even when the full dip-out process is performed.

Figure 2G:
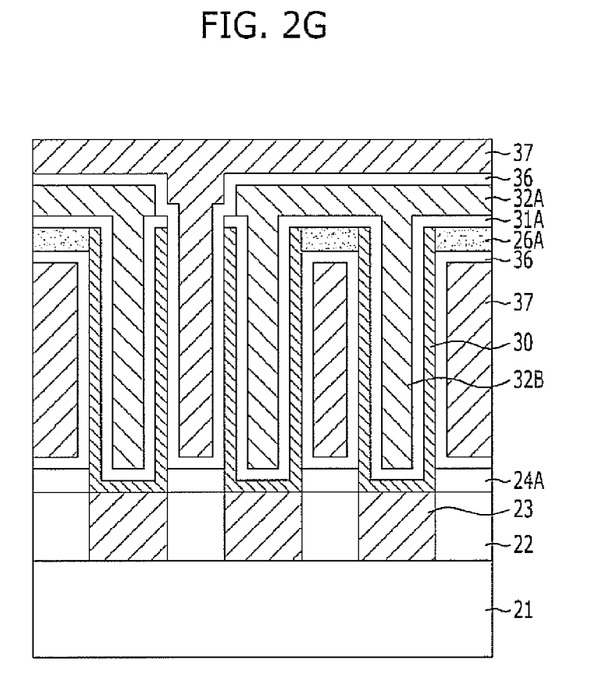

Referring to FIG. 2G, a second dielectric layer 36 is formed. The second dielectric layer 36 is formed on the outer walls of the lower electrodes 30. Also, the second dielectric layer 36 is formed on the first upper electrode 32A.

Subsequently, a third conductive layer 37 is formed on the second dielectric layer 36. The third conductive layer 37 may include a metal nitride. For example, the third conductive layer 37 may include a titanium nitride. The third conductive layer 37 is formed on the second dielectric layer 36 while filling the spaces between the lower electrodes 30. The third conductive layer 37 is not connected with the first upper electrode 32A due to the presence of the second dielectric layer 36.

Figure 2H:
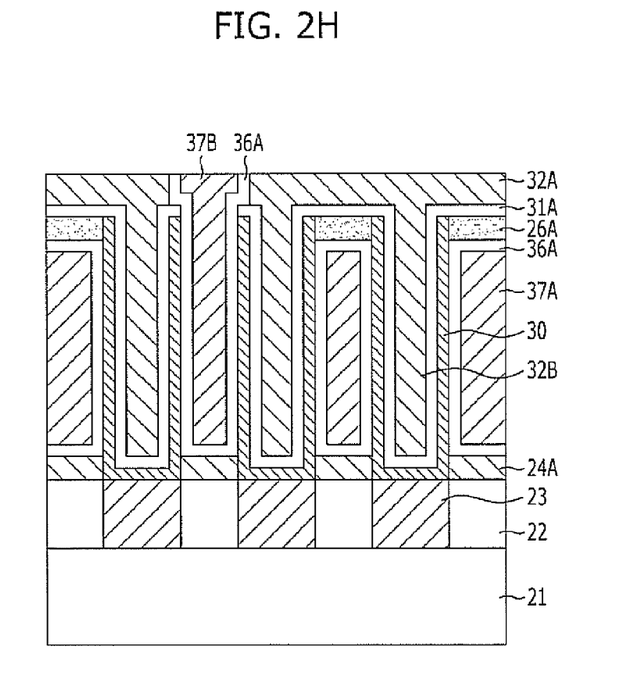

Referring to FIG. 2H, the third conductive layer 37 is planarized. Thus, portions of the third conductive layer 37 and the second dielectric layer 36 present on the first upper electrode 32A may be removed. The planarization process is performed until the surface of the first upper electrode 32A is exposed. Accordingly, the third conductive layer 37 remains outside the lower electrodes 30, that is, between the lower electrodes 30, and is referred to as a second upper electrode 37A. The second upper electrode 37A includes a connection part 37B filled in the through hole 34. The second upper electrode 37A has a shape for surrounding the outer walls of the lower electrodes 30. After the planarization, the second dielectric layer 36 remains as designated by the reference numeral 36A.

Figure 2I:
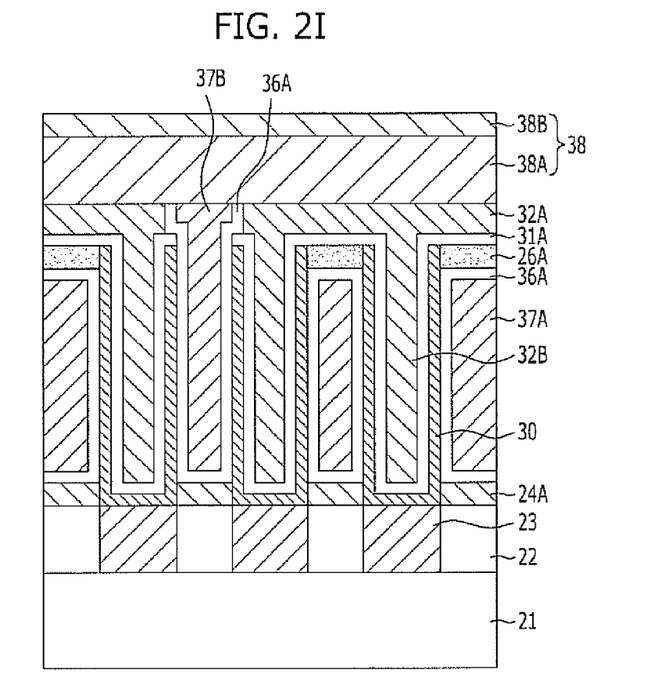

Referring to FIG. 2I, by forming and subsequently patterning a fourth conductive layer, a third upper electrode 38 is formed. The third upper electrode 38 may be formed by stacking a silicon germanium layer 38A and a tungsten layer 38B, thereby decreasing resistance. The third upper electrode 38 is electrically connected with the first upper electrode 32A and the second upper electrode 37A. The second upper electrode 37A is electrically connected with the third upper electrode 38 through the connection part 37B, and the first upper electrode 32A and the third upper electrode 38 are directly connected with each other.

Figure 3A:
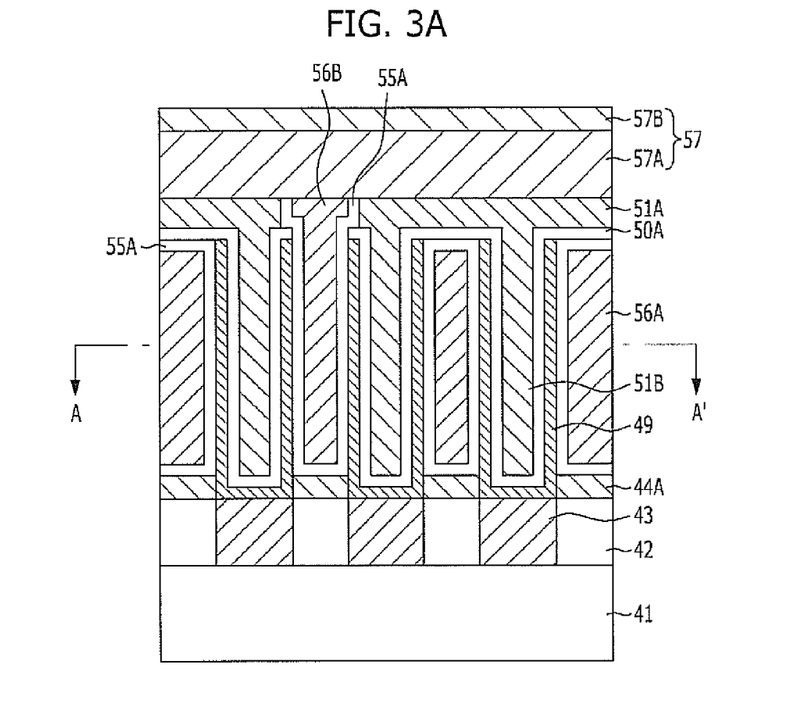
FIG. 3A is a cross-sectional view illustrating a capacitor in accordance with a second embodiment of the present invention.
Figure 3B:
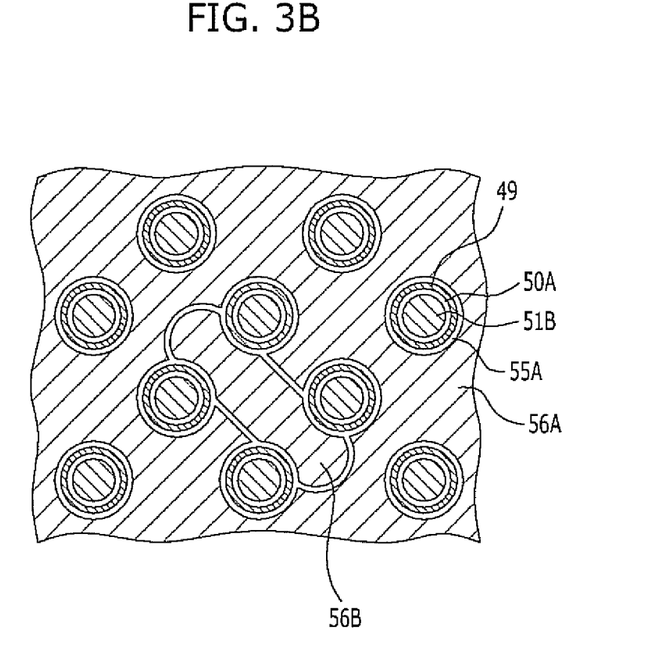
FIG. 3B is a cross-sectional view taken along the line A-A' of FIG. 3A.

FIG. 3A is a cross-sectional view illustrating a capacitor in accordance with a second embodiment of the present invention. FIG. 3B is a cross-sectional view taken along the line A-A' of FIG. 3A.

Referring to FIGS. 3A and 3B, an interlayer dielectric layer 42 is formed on a semiconductor substrate 41. A plurality of contact plugs 43 are formed in contact holes, which are defined in the interlayer dielectric layer 42. Cylinder type lower electrodes 49 are respectively formed on the contact plugs 43. An etch stop layer 44A is formed on the outer walls of the lower end portions of the lower electrodes 49. A first upper electrode 51A is formed in the lower electrodes 49. The first upper electrode 51A may include pillar parts 51B which fill the lower electrodes 49. A first dielectric layer 50A is formed between the first upper electrode 51A and the lower electrodes 49. A second upper electrode 56A is formed outside the lower electrodes 49, that is, between the lower electrodes 49. The second upper electrode 56A has a shape for surrounding the outer walls of the lower electrodes 49. The second upper electrode 56A may include a connection part 56B. A second dielectric layer 55A is formed between the second upper electrode 56A and the lower electrodes 49. A third upper electrode 57 is formed on the first and second upper electrodes 51A and 56A. The connection part 56B of the second upper electrode 56A and the first upper electrode 51A are connected with each other through the third upper electrode 57. The third upper electrode 57 may be formed by stacking a silicon germanium layer 57A and a tungsten layer 57B.

According to FIGS. 3A and 3B, the first upper electrode 51A is formed in the cylinder type lower electrodes 49, the second upper electrode 56A is formed outside the cylinder type lower electrodes 49, and the third upper electrode 57 is formed on the second upper electrode 56A. The second upper electrode 56A has the shape for surrounding the outer walls of the cylinder type lower electrodes 49. The third upper electrode 57 electrically connects the first upper electrode 51A and the second upper electrode 56A.

As described above, in the capacitor in accordance with the second embodiment of the present invention, an upper electrode is constituted by the first to third upper electrodes 51A, 56A and 57. The first upper electrode 51A serves as a prop/support for preventing the lower electrodes 49 from leaning or bending. More specifically, since the pillar parts 51B of the first upper electrode 51A fill the lower electrodes 49, supporting force increases. Moreover, because the supporting force increases by the pillar parts 51B of the first upper electrode 51A, the thickness of the lower electrodes 49 may be decreased.

FIGS. 4A to 4I are cross-sectional views illustrating a method for fabricating the capacitor in accordance with the second embodiment of the present invention.

Figure 4A:
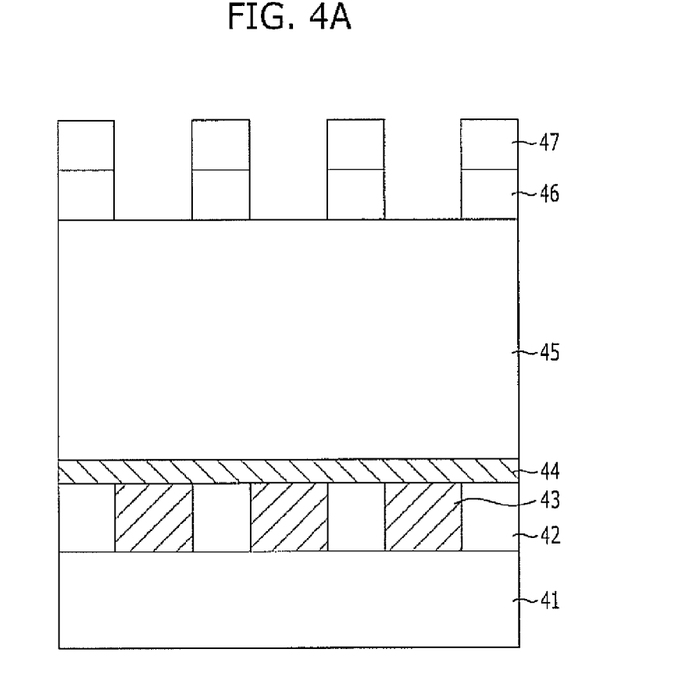

Referring to FIG. 4A, a plurality of contact plugs 43 are formed on a semiconductor substrate 41 to pass through an interlayer dielectric layer 42. The semiconductor substrate 41 includes a silicon-containing substance. For example, the semiconductor substrate 41 may include a silicon substrate, a silicon germanium substrate, or the like. The interlayer dielectric layer 42 may include a silicon oxide such as BPSG. While not shown, a process for forming transistors and wiring lines may be additionally performed on the semiconductor substrate 41 before forming the interlayer dielectric layer 42. The contact plugs 43 may be connected to impurity regions (not shown) formed in the semiconductor substrate 41 through contact holes defined in the interlayer dielectric layer 42. The contact plugs 43 may be formed by forming a conductive layer in the contact holes and subsequently planarizing the conductive layer until the upper surface of the interlayer dielectric layer 42 is exposed. The contact plugs 43 may include a metal layer, a metal nitride layer, a noble metal layer, a refractory metal layer, polysilicon, or the like.

An etch stop layer 44 is formed on the interlayer dielectric layer 42 including the contact plugs 43. The etch stop layer 44 may include a dielectric substance. For example, the etch stop layer 44 may include a nitride such as a silicon nitride.

A mold layer 45 is formed on the etch stop layer 44. The mold layer 45 is a substance provided to form lower electrodes (or storage nodes). The mold layer 45 includes a substance with a high etching selectivity with respect to the etch stop layer 44. Also, the mold layer 45 includes a substance easily removable through wet etching. For example, the mold layer 45 may include an oxide such as a silicon oxide. In another embodiment, the mold layer 45 may include a multi-layered oxide. For example, the mold layer 45 may include BPSG, USG, PETEOS, PSG, HDP, or the like. In still another embodiment, the mold layer 45 may include a silicon-containing substance. For example, the mold layer 45 may include a polysilicon layer or a silicon germanium layer.

Hard mask patterns 46 are formed on the mold layer 45. The hard mask patterns 46 may be formed using first photoresist patterns 47. The hard mask patterns 46 may include a silicon nitride layer, amorphous carbon, or the like.

Figure 4B:
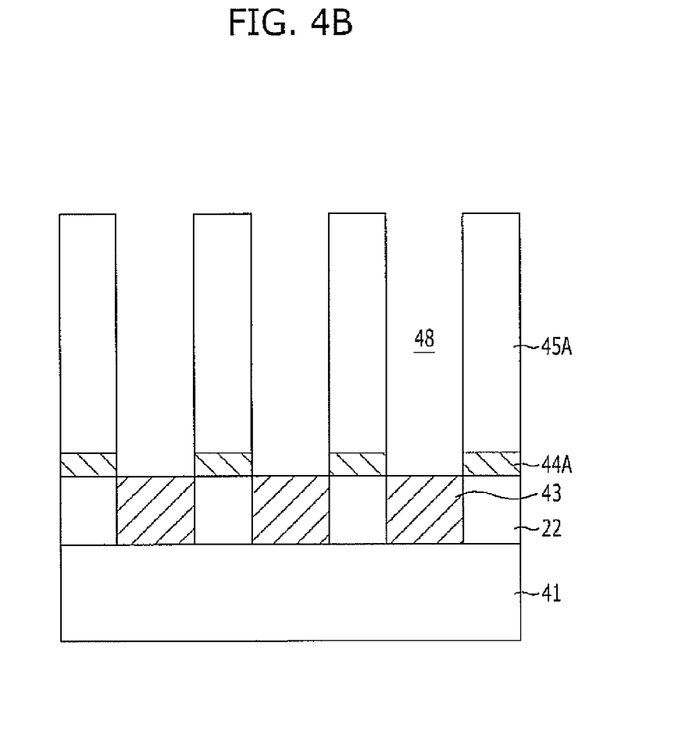

Referring to FIG. 4B, after stripping the first photoresist patterns 47, the mold layer 45 and the etch stop layer 44 are etched using the hard mask patterns 46 as an etch barrier. Thus, open parts 48 are defined to expose the contact plugs 43. The open parts 48 expose the surfaces of the contact plugs 43. The open parts 48 may have the shapes of contact holes. In order to define the open parts 48, the mold layer 45 may be etched until stopping at the etch stop layer 44, and subsequently, the etch stop layer 44 may be etched. Accordingly, the open parts 48 are defined in the stack structure of an etch stop layer 44A and a mold layer 45A. Lower electrodes are formed in the open parts 48 in a subsequent process.

Next, the hard mask patterns 46 are removed.

Figure 4C:
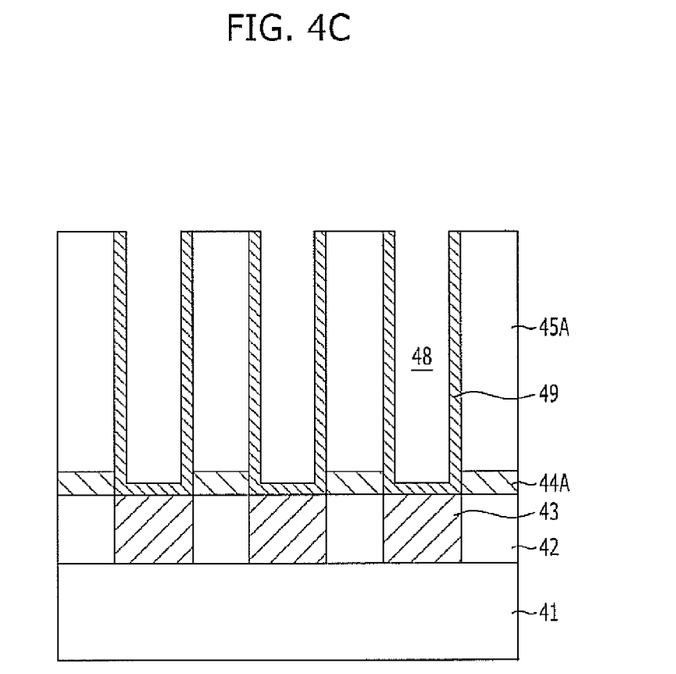

Referring to FIG. 4C, lower electrodes 49 are formed in the open parts 48.

The lower electrodes 49 may be a cylinder type or a pillar type. Hereinbelow, in the embodiment, the lower electrodes 49 will be referred to as cylinder type lower electrodes.

In order to form the lower electrodes 49, a first conductive layer may be deposited on the entire surface including the open parts 48, and subsequently a lower electrode separating process may be performed. The first conductive layer as the lower electrodes 49 may be formed as a metal layer, a metal nitride layer or a stack layer in which a metal layer and a metal nitride layer are stacked. The first conductive layer may be formed through chemical vapor deposition (CVD) or atomic layer deposition (ALD). For example, the lower electrodes 49 may be formed as a stack layer in which a titanium layer and a titanium nitride layer are stacked.

Since the lower electrodes 49 are the cylinder type, the lower electrodes 49 have inner walls and outer walls.

Figure 4D:
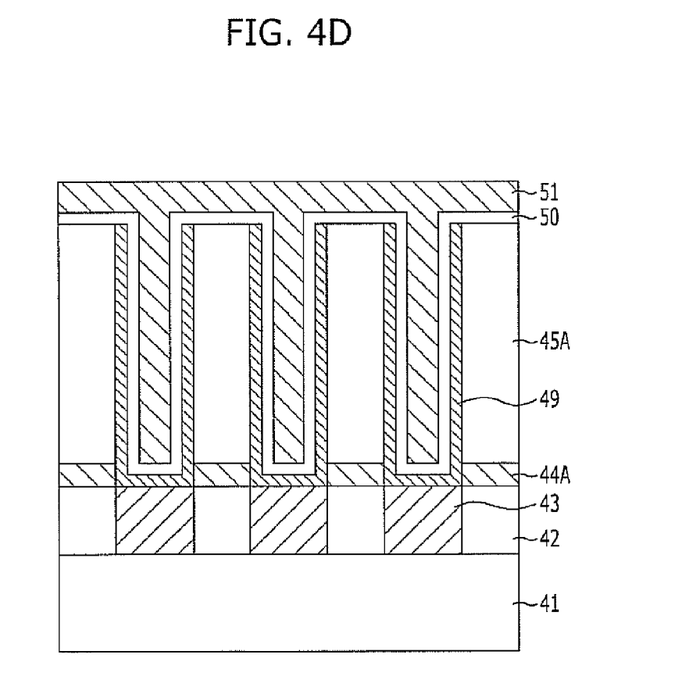

Referring to FIG. 4D, a first dielectric layer 50 and a second conductive layer 51 are sequentially formed on the entire surface including the lower electrodes 49. The second conductive layer 51 becomes a first upper electrode. The second conductive layer 51 includes a metal nitride layer. For example, the second conductive layer 51 may include a titanium nitride layer (TiN). The second conductive layer 51 is filled in the cylinders of the lower electrodes 49 over the first dielectric layer 50.

Figure 4E:
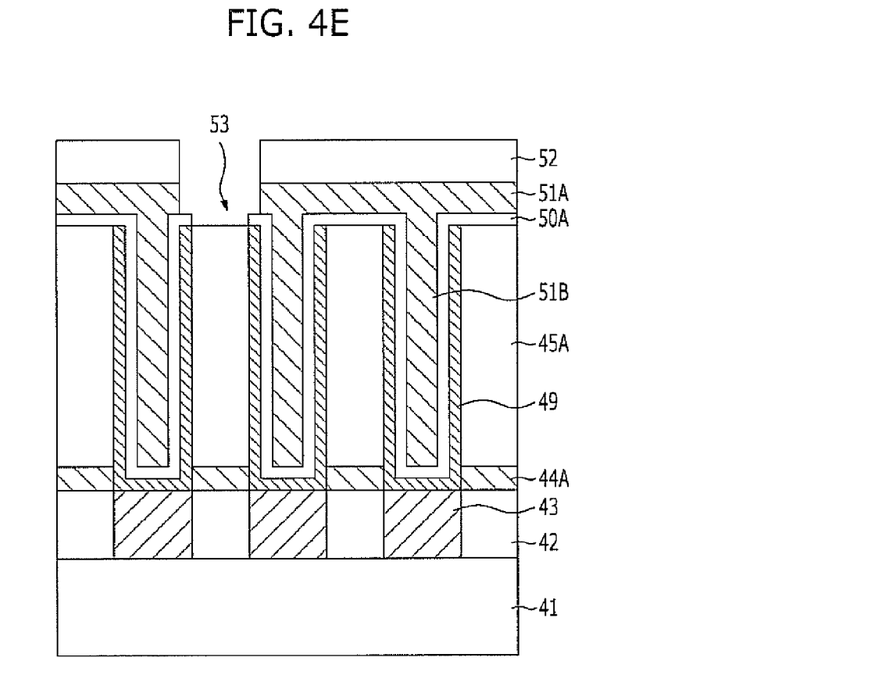

Referring to FIG. 4E, a second photoresist pattern 52 is formed on the second conductive layer 51. The second photoresist pattern 52 is a mask for selectively etching a portion of the second conductive layer 51.

Using the second photoresist pattern 52 as an etch barrier, the second conductive layer 51 and the first dielectric layer 50 are etched. Thus, a through hole 53 through which a chemical is to flow subsequently is defined. The through hole 53 is used as a path for flowing the chemical to remove the mold layer 45A. The number of through holes 53 may be selectively controlled.

By defining the through hole 53 in this way, the second conductive layer 51 becomes a first upper electrode 51A. The first upper electrode 51A includes pillar parts 51B, which fill the cylinder type lower electrodes 49, and covers the upper parts of the cylinder type lower electrodes 49. Here, after the formation of the through hole 53, the first dielectric layer 50 remains as designated by the reference numeral 50A. Because the pillar parts 51B of the first upper electrode 51A fill the lower electrodes 49, supporting force is increased.

Figure 4F:
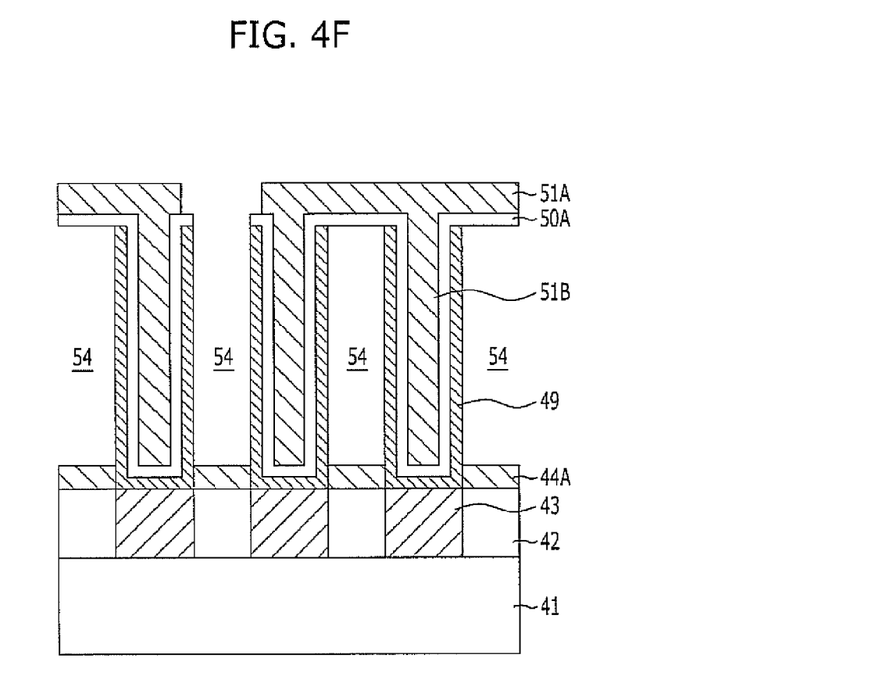

Referring to FIG. 4F, after removing the second photoresist pattern 52, the mold layer 45A exposed through the through hole 53 is fully removed. To this end, a full dip-out process is performed. The full dip-out process may be performed using a wet chemical. The lower electrodes 49, the first dielectric layer 50A and the first upper electrode 51A are not removed. In particular, since the first dielectric layer 50A, which uses an oxide similarly to the mold layer 45A, is interposed between the lower electrodes 49 and the first upper electrode 51A and is not exposed to the chemical, the first dielectric layer 50A is not etched. Also, the contact plugs 43 are not damaged due to the presence of the etch stop layer 44A. Here, the full dip-out process may use a hydrofluoric acid-based chemical.

As the mold layer 45A is entirely removed as described above, empty spaces 54 are defined outside the lower electrodes 49. Since the first dielectric layer 50A and the pillar parts 51B of the first upper electrode 51A are filled in the lower electrodes 49, a structure for preventing the lower electrodes 49 from leaning or bending is obtained. In other words, because the first dielectric layer 50A and the first upper electrode 51A are filled in the cylinders of the lower electrodes 49, the lower electrodes 49 are prevented from leaning or bending even when the full dip-out process is performed.

Figure 4G:
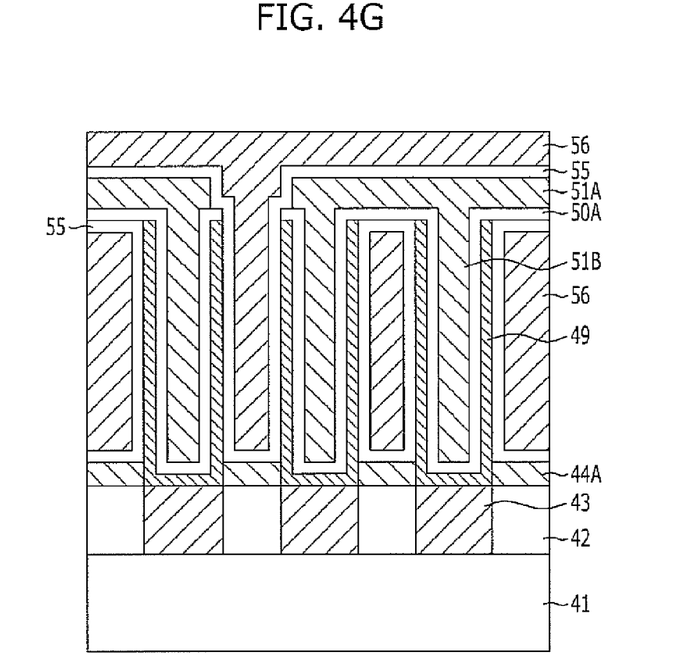

Referring to FIG. 4G, a second dielectric layer 55 is formed. The second dielectric layer 55 is formed on the outer walls of the lower electrodes 49. Also, the second dielectric layer 55 is formed on the first upper electrode 51A.

Subsequently, a third conductive layer 56 is formed on the second dielectric layer 55. The third conductive layer 56 may include a metal nitride. For example, the third conductive layer 56 may include a titanium nitride. The third conductive layer 56 is formed on the second dielectric layer 55 while filling the spaces between the lower electrodes 49. The third conductive layer 56 is not connected with the first upper electrode 51A due to the presence of the second dielectric layer 55.

Figure 4H:
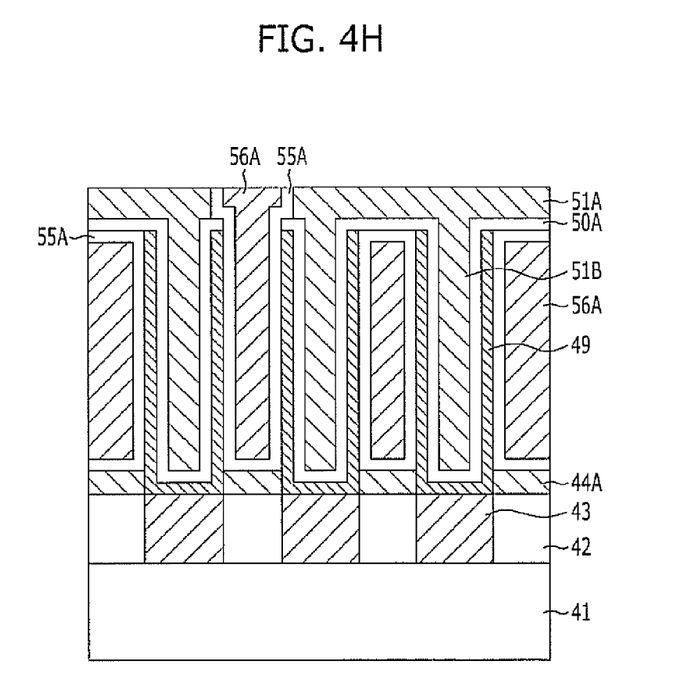

Referring to FIG. 4H, the third conductive layer 56 is planarized. Thus, portions of the third conductive layer 56 and the second dielectric layer 55 present on the first upper electrode 51A may be removed. The planarization process is performed until the surface of the first upper electrode 51A is exposed. Accordingly, the third conductive layer 56 remains outside the lower electrodes 49, that is, between the lower electrodes 49, and is referred to as a second upper electrode 56A. The second upper electrode 56A includes a connection part 56B filled in the through hole 53. The second upper electrode 56A has a shape for surrounding the outer walls of the lower electrodes 49. After the planarization, the second dielectric layer 55 remains as designated by the reference numeral 55A.

Figure 4I:
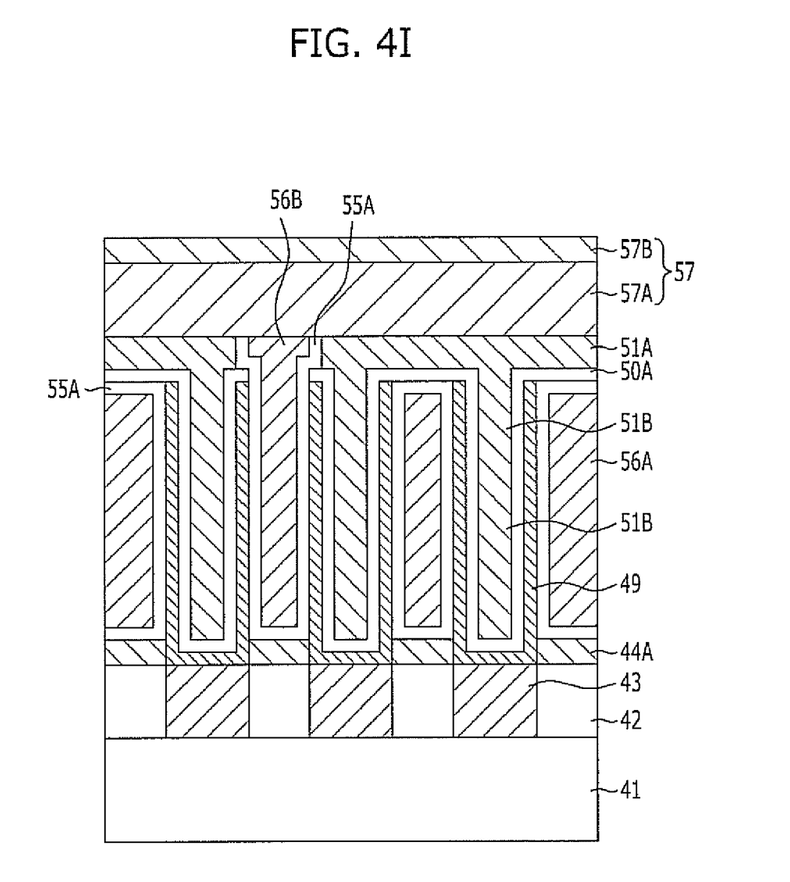

Referring to FIG. 4I, by forming and subsequently patterning a fourth conductive layer, a third upper electrode 57 is formed. The third upper electrode 57 may be formed by stacking a silicon germanium layer 57A and a tungsten layer 57B, thereby decreasing resistance. The third upper electrode 57 is electrically connected with the first upper electrode 51A and the second upper electrode 56A. The second upper electrode 56A is electrically connected with the third upper electrode 57 through the connection part 56B, and the first upper electrode 51A and the third upper electrode 57 are, for example, directly connected with each other.

As is apparent from the above descriptions, in the embodiments of the present invention, since pillar type upper electrodes are preliminarily formed in cylinder type lower electrodes, the lower electrodes are prevented from leaning or bending in a subsequent dip-out process. Furthermore, since supporting force is increased due to the presence of the pillar type upper electrodes, the thickness of the lower electrodes may be decreased.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor, comprising:
   forming a plurality of cylinder type lower electrodes;
   forming a first upper electrode inside the cylinder type lower electrodes;
   forming a second upper electrode outside the cylinder type lower electrodes after the forming of the first upper electrode; and
   forming a third upper electrode that connects the first upper electrode and the second upper electrode.

2. The method of claim 1, wherein the forming of the plurality of cylinder type lower electrodes comprises:
   forming a mold structure over a substrate;
   etching the mold structure and defining a plurality of open parts;
   forming a conductive layer over an entire surface of a structure including the plurality of open parts; and
   separating the conductive layer and forming the cylinder type lower electrodes in the open parts.

3. The method of claim 2, further comprising:
   removing the mold structure through a full dip-out process before the forming of the second upper electrode.

4. The method of claim 1, wherein each of the first upper electrode and the second upper electrode comprises a titanium nitride layer.

5. The method of claim 1, wherein the third upper electrode is formed by stacking a silicon germanium layer and a tungsten layer.

6. A method for fabricating a capacitor, comprising:
   forming a mold structure over a substrate, wherein the mold structure has a plurality of open parts and has a mold layer stacked with a support layer;
   forming cylinder type lower electrodes in the open parts;
   forming a first upper electrode over an entire surface of a structure including the cylinder type lower electrodes to fill the cylinder type lower electrodes;
   defining a through hole that passes through portions of the first upper electrode and the support layer;
   removing the mold layer through the through hole and exposing the cylinder type lower electrodes;
   forming a second upper electrode to fill the through hole and spaces between the cylinder type lower electrodes; and
   forming a third upper electrode to connect the second upper electrode and the first upper electrode with each other.

7. The method of claim 6, wherein the forming of the second upper electrode comprises:
   forming a conductive layer between the cylinder type lower electrodes through the through hole and over the first upper electrode; and
   planarizing the conductive layer until a surface of the first upper electrode is exposed.

8. The method of claim 6, wherein the method further comprises:
   forming a first dielectric layer before the forming of the first upper electrode; and
   forming a second dielectric layer before the forming of the second upper electrode.

9. The method of claim 6, wherein the defining of the through hole comprises:
   forming a mask pattern over the first upper electrode, wherein the mask pattern is defined with a through hole; and
   etching the first upper electrode and the support layer using the mask pattern as an etch barrier.

10. The method of claim 6, wherein each of the first upper electrode and the second upper electrode comprises a titanium nitride layer.

11. The method of claim 6, wherein the third upper electrode is formed by stacking a silicon germanium layer and a tungsten layer.

12. The method of claim 6, wherein the mold layer comprises an oxide layer or a silicon layer.

13. The method of claim 6, wherein the support layer comprises a nitride layer.

14. A method for fabricating a capacitor, comprising:
forming a mold layer over a substrate, wherein the mold layer has a plurality of open parts;
forming cylinder type lower electrodes in the open parts;
forming a first upper electrode over an entire surface of a structure including the cylinder type lower electrodes to fill the cylinder type lower electrodes;
defining a through hole that passes through a portion of the first upper electrode;
removing the mold layer through the through hole and exposing the cylinder type lower electrodes;
forming a second upper electrode to fill the through hole and spaces between the cylinder type lower electrodes; and
forming a third upper electrode to connect the second upper electrode and the first upper electrode with each other.

15. The method of claim 14, wherein the forming of the second upper electrode comprises:
forming a conductive layer between the cylinder type lower electrodes through the through hole and over the first upper electrode; and
planarizing the conductive layer until a surface of the first upper electrode is exposed.

16. The method of claim 14, wherein the method further comprises:
forming a first dielectric layer before the forming of the first upper electrode; and
forming a second dielectric layer before the forming of the second upper electrode.

17. The method of claim 14, wherein the defining of the through hole comprises:
forming a mask pattern over the first upper electrode, wherein the mask pattern is defined with a through hole; and
etching the first upper electrode using the mask pattern as an etch barrier.

18. The method of claim 14, wherein each of the first upper electrode and the second upper electrode comprises a titanium nitride layer.

19. The method of claim 14, wherein the third upper electrode is formed by stacking a silicon germanium layer and a tungsten layer.

20. The method of claim 14, wherein the mold layer comprises an oxide layer or a silicon layer.

21. A capacitor comprising:
a plurality of cylinder type lower electrodes;
a support layer supporting outer walls of the cylinder type lower electrodes and having a through hole that opens spaces between the cylinder type lower electrodes;
a first upper electrode formed in the cylinder type lower electrodes;
a second upper electrode surrounding the outer walls of the cylinder type lower electrodes; and
a third upper electrode connecting the first upper electrode and the second upper electrode with each other,
wherein the second upper electrode includes a connection part filled in the through hole formed over entire sidewall of the cylinder type lower electrodes,
wherein top surfaces of the first upper electrode and the connection part are on the same plane, coupled to the third upper electrode.

22. The capacitor of claim 21, further comprising:
a first dielectric layer formed between the first upper electrode and the cylinder type lower electrodes; and
a second dielectric layer formed between the second upper electrode and the cylinder type lower electrodes.

23. The capacitor of claim 21, wherein the first upper electrode fills the cylinder type lower electrodes.

24. The capacitor of claim 23, wherein the first upper electrode, the second upper electrode and the third upper electrode are electrically connected through the connection part.

25. The capacitor of claim 21, wherein each of the first upper electrode and the second upper electrode comprises a titanium nitride layer.

26. The capacitor of claim 21, wherein the third upper electrode is formed by stacking a silicon germanium layer and a tungsten layer.

* * * * *